United States Patent
Wu et al.

(10) Patent No.: US 10,917,061 B2
(45) Date of Patent: Feb. 9, 2021

(54) ELECTRONIC DEVICE AND EQUALIZER ADJUSTMENT METHOD THEREOF FOR ADJUSTING GAIN SETTINGS OF AN EQUALIZER ACCORDING TO THE VOLUME OF THE OUTPUT SIGNAL

(71) Applicant: Unlimiter MFA Co., Ltd., Eden Island (SC)

(72) Inventors: Po-Jui Wu, Taipei (TW); Kuo-Ping Yang, Taipei (TW); Kuan-Li Chao, Taipei (TW); Jian-Ying Li, Taipei (TW); Wei-Lin Chang, Taipei (TW); Kai-Yuan Hsiao, Taipei (TW)

(73) Assignee: PIXART IMAGING INC., Hsin-Chu County (TW)

( * ) Notice: Subject to any disclaimer, the term of this patent is extended or adjusted under 35 U.S.C. 154(b) by 0 days.

(21) Appl. No.: 16/705,346

(22) Filed: Dec. 6, 2019

(65) Prior Publication Data

US 2020/0403591 A1   Dec. 24, 2020

(30) Foreign Application Priority Data

Jun. 20, 2019  (TW) .............................. 108121591 A

(51) Int. Cl.
   *H03G 5/16*   (2006.01)
   *H04R 29/00*   (2006.01)
(52) U.S. Cl.
   CPC ............ *H03G 5/165* (2013.01); *H04R 29/001* (2013.01)
(58) Field of Classification Search
   CPC .......... H03G 5/16; H03G 5/025; H03G 5/165; H04R 29/00

USPC ................................... 381/103, 106, 109, 98
See application file for complete search history.

(56) References Cited

U.S. PATENT DOCUMENTS

| 9,706,302 | B2   | 7/2017  | Hansen et al. |
| 10,466,959 | B1 * | 11/2019 | Yang ........................ G10L 25/51 |
| 2009/0174823 | A1 * | 7/2009  | Knutson ................ H03G 5/005 348/738 |

(Continued)

FOREIGN PATENT DOCUMENTS

| CN | 10 5049993 A | 11/2015 |
| CN | 10 9040885 A | 12/2018 |

OTHER PUBLICATIONS

Office Action dated Aug. 13, 2020 issued in corresponding Taiwanese application. (no copy attached).

*Primary Examiner* — Melur Ramakrishnaiah
(74) *Attorney, Agent, or Firm* — Bacon & Thomas, PLLC

(57) ABSTRACT

An electronic device and an equalizer adjustment method thereof for adjusting gain settings of an equalizer according to the volume of the output signal are disclosed. The method includes the steps of: setting a volume gain value table including a plurality of volume values through a gain value setting module, which are a first volume value to an Nth volume value with volume incrementally increasing, each of the plurality of volume values including a set of correction parameters which including a plurality of compensation gain values corresponding to a plurality of target frequencies, respectively; storing the volume gain value table in a storage module; obtaining a volume of the output signal; loading the volume gain value table according to the volume of the output signal to obtain the corresponding set of correction parameters; and adjusting gain value settings of an equalizer for different frequencies of sound.

13 Claims, 2 Drawing Sheets

(56) References Cited

U.S. PATENT DOCUMENTS

2017/0207762 A1\* 7/2017 Porter .................. H03G 3/3005
2019/0214958 A1\* 7/2019 Kulavik ............... H03G 3/3089

\* cited by examiner

ELECTRONIC DEVICE AND EQUALIZER ADJUSTMENT METHOD THEREOF FOR ADJUSTING GAIN SETTINGS OF AN EQUALIZER ACCORDING TO THE VOLUME OF THE OUTPUT SIGNAL

BACKGROUND OF THE INVENTION

1. Field of the Invention

The present invention relates to an electronic device and an equalizer adjustment method thereof, and more particularly, to an electronic device and an equalizer adjustment method thereof for adjusting gain settings of an equalizer according to the volume of the output signal.

2. Description of the Related Art

An equalizer (EQ) is a tool for adjusting sound and can adjust the gain value of the sound in each frequency band. In other words, the gain value of the sound (or an audio file) at different frequencies can be adjusted by equalizers to change the acoustic properties of the output sound. For example, sounds of explosions provided by subwoofers produce a more powerful and realistic effect for listeners. Thus, currently, equalizers are mainly used for adjusting audio output, including the output of sound effects. Nowadays, most computers have equalizer applications for a user to use when he or she listens to music for enjoyment.

When adjusting the gain value setting of equalizers, usually the user can adjust the gain value of each individual frequency. Alternatively, many equalizers also provide several different built-in modes. The user can just choose one of the built-in modes to adjust the gain values of multiple frequencies at the same time when he or she listens to music for enjoyment. In general, the human ear's sensitivity varies with frequency. Thus, the user may increase or reduce the gain values of certain frequencies in order to ensure the best auditory experience. However, when the volume is adjusted, the volume of the sound at all frequencies is adjusted simultaneously without adjustments of the acoustic properties of the output sound. Therefore, after the gain values of the frequencies are adjusted, the volume of the sound at the frequencies may be too high or too low. As a result, the user has to adjust the gain values again, which is very inconvenient.

Therefore, it is desirable to provide an improved electronic device and an equalizer adjustment method thereof to mitigate and/or obviate the aforementioned problems.

SUMMARY OF THE INVENTION

It is a main object of the present invention to provide an equalizer adjustment method for adjusting gain settings of an equalizer according to the volume of the output signal.

It is another main object of the present invention to provide an electronic device used in the aforementioned method.

In order to achieve the above-mentioned objects, the electronic device of the present invention comprises an equalizer, a gain value setting module, a storage module, and an equalizer adjustment module. The gain value setting module is used for setting a volume gain value table. The volume gain value table comprises a plurality of volume values, which are a first volume value to an Nth volume value. Moreover, the volume incrementally increases from the first volume value to the Nth volume value. Each of the plurality of volume values comprises a set of correction parameters. The set of correction parameters comprises a plurality of compensation gain values corresponding to a plurality of target frequencies, respectively. The storage module is electrically connected to the gain value setting module and used for storing the volume gain value table. The equalizer adjustment module comprises a volume detection unit, a parameter lookup unit, and a parameter setting unit. The volume detection unit is used for obtaining a volume of an output signal. The parameter lookup unit is used for obtaining the set of correction parameters corresponding to the volume of the output signal. The parameter setting unit is used for adjusting gain value settings of the equalizer for different frequencies of sound according to the set of correction parameters.

The equalizer adjustment method of the present invention comprises the following steps: setting a volume gain value table through a gain value setting module, the volume gain value table comprising a plurality of volume values, which are a first volume value to an Nth volume value, the volume incrementally increasing from the first volume value to the Nth volume value, each of the plurality of volume values comprising a set of correction parameters, the set of correction parameters comprising a plurality of compensation gain values corresponding to a plurality of target frequencies, respectively; storing the volume gain value table in a storage module; obtaining a volume of an output signal; loading the volume gain value table according to the volume of the output signal to obtain the corresponding set of correction parameters; and adjusting gain value settings of an equalizer for different frequencies of sound according to the set of correction parameters through an equalizer adjustment module.

DETAILED DESCRIPTION OF THE PREFERRED EMBODIMENT

The advantages and innovative features of the invention will become more apparent from the following detailed description when taken in conjunction with the accompanying drawings.

Figure 1:
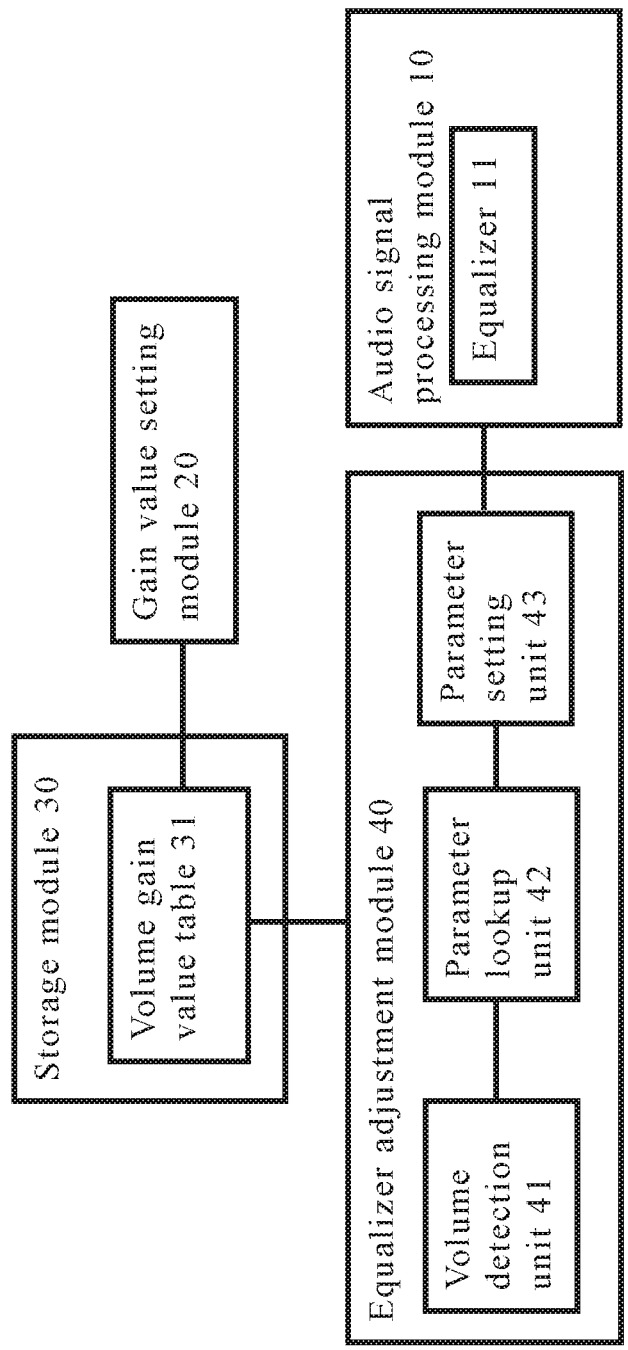
FIG. 1 is a schematic drawing of the structure of an electronic device of the present invention.

First, for the following description, please refer to FIG. 1. FIG. 1 is a schematic drawing of the structure of an electronic device of the present invention.

In this embodiment of the present invention, an electronic device 1 can be a notebook computer, a tablet computer, a smartphone, or other electronic devices with computing and processing capabilities; however, the present invention is not limited thereto. For example, the electronic device 1 of this embodiment can also be an audio playing device (speaker) with a central processing unit (CPU) or other processor. The electronic device 1 comprises an audio signal processing module 10, an equalizer 11, a gain value setting module 20, a storage module 30, and an equalizer adjustment module 40. The equalizer 11 is located in the audio signal processing module 10. More specifically, the audio signal processing module 10 can store the software of the equalizer 11, the firmware of the equalizer 11, or a combination of the two such that the equalizer 11 is located in the audio signal processing module 10. The gain values of the output sound of the audio signal processing module 10 at different frequencies can be adjusted by adjusting the gain value setting of the equalizer 11. For example, raising the gain value of a specific frequency of 100 Hz to 10 dB will increase the volume of the output sound at 100 Hz by 10 dB. Currently, the equalizer 11 is a common tool for adjusting audio output. Since its structure and principle are well known to those of reasonable skill in the art, there is no need for further description.

The gain value setting module 20 is used for setting a volume gain value table 31 stored in the storage module 30. The gain values of the volume gain value table 31 can be the default values set by the gain value setting module 20 or can beset or adjusted by a user through the gain value setting module 20. The volume gain value table 31 comprises a plurality of volume values, which are a first volume value to an Nth volume value. Moreover, the volume incrementally increases from the first volume value to the Nth volume value. Each of the plurality of volume values comprises a set of correction parameters. The set of correction parameters comprises a plurality of compensation gain values corresponding to a plurality of target frequencies, respectively. The lower the volume is, the more the volume of the sound at a low frequency is increased by the gain value setting module 20 and the more the volume of the sound at a high frequency is decreased by the gain value setting module 20, as shown in the following table.

| volume (level)\ frequency (Hz) | 100 | 1 k | 10 k |
|---|---|---|---|
| 0 | 10 | 0 | −10 |
| 1 | 8 | 0 | −9 |
| 2 | 6 | 0 | −8 |
| 3 | 4 | 0 | −7 |
| 4 | 2 | 0 | −6 |
| 5 | 0 | 0 | −5 |
| 6 | 0 | 0 | −4 |
| 7 | 0 | 0 | −3 |
| 8 | 0 | 0 | −2 |
| 9 | 0 | 0 | −1 |
| 10 | 0 | 0 | 0 |

The volume gain value table 31 comprises volume values in ascending order, which are from the first volume value to the Nth volume value. For example, the volume levels of the electronic device 1 range from 0 to 10. Volume level 0, which is the first volume value, indicates the minimum volume. Volume level 10, which is the Nth volume value, indicates the maximum volume. Thus, in this embodiment, the N volume values, which are the first volume value to the Nth volume value, indicate the eleven different volumes of the electronic device 1, respectively. Each compensation gain value corresponds to each volume value and each frequency (100 Hz, 1 kHz, or 10 kHz). As shown in the volume gain value table 31, the plurality of compensation gain values are between −10 and 10. Thus, the volume at specific frequencies may be increased or decreased. When the plurality of target frequencies are equal to or lower than 100 Hz, the plurality of compensation gain values corresponding to the plurality of target frequencies are between 0 and 10. When the plurality of target frequencies are equal to or higher than 10 kHz, the plurality of compensation gain values corresponding to the plurality of target frequencies are between −10 and 0. When the target frequency is 1 kHz, the compensation gain values are 0 (no adjustment made). However, it is noted that the aforementioned compensation gain values of the volume gain value table 31 are provided merely as an example. The present invention is not limited to adjustments to the gain values of the frequencies 100 Hz, 1 kHz, and 10 kHz. When the target frequencies are lower than 100 Hz, the gain values of the target frequencies are adjusted simultaneously. When the target frequencies are higher than 10 kHz, the gain values of the target frequencies are adjusted simultaneously, too. However, please note that the scope of the present invention is not limited to the above description. Alternatively, when the volume gain value table 31 is set, only the compensation gain values of certain volume values are set. For example, only the compensation gain values of a maximum volume value, a minimum volume value, and an intermediate volume value corresponding to the frequencies, respectively, are set. The compensation gain values of the rest of the volume values can be calculated by using an interpolation.

The storage module 30 can be a removable/non-removable non-volatile computer-readable storage medium, which includes, but is not limited to, random access memory (RAM), read-only memory (ROM), flash memory, an optical disc, or the like, or a combination of any of the above, or can be made by using analog circuit design. The storage module 30 stores the volume gain value table 31 set by the gain value setting module 20. The equalizer adjustment module 40 is electrically connected to the storage module 30 and the equalizer 11. The equalizer adjustment module 40 comprises a volume detection unit 41, a parameter lookup unit 42, and a parameter setting unit 43. The volume detection unit 41 is used for obtaining a volume of an output signal of the electronic device 1. In one embodiment of the present invention, the volume detection unit 41 obtains the volume of the output signal by directly detecting a current volume level of the electronic device 1. However, please note that the scope of the present invention is not limited to the above description.

The parameter lookup unit 42 loads the volume gain value table 31 according to the volume of the output signal to obtain the corresponding set of correction parameters. Last, the parameter setting unit 43 adjusts gain value settings of the equalizer 11 for different frequencies of sound according to the set of correction parameters obtained by the parameter lookup unit 42.

It is noted that the modules of the electronic device 1 may individually be configured as a hardware device, a combination of a software program and a hardware device, a combination of firmware and a hardware device, etc. For example, a computer program product can be stored on a computer-readable medium to perform the functions of the present invention. However, please note that the scope of the present invention is not limited to the above description. In addition, the embodiment described is a preferred embodiment of the present invention provided for reference. To avoid redundancy, not all possible combinations are described in detail. However, those skilled in the art may understand that not all the aforementioned modules or units are necessary. Other detailed modules or units of the prior art may be included in order to execute the present invention. Any of the modules or units can be omitted or modified depending on user requirements, and other modules or units may or may not exist between any two modules.

Figure 2:
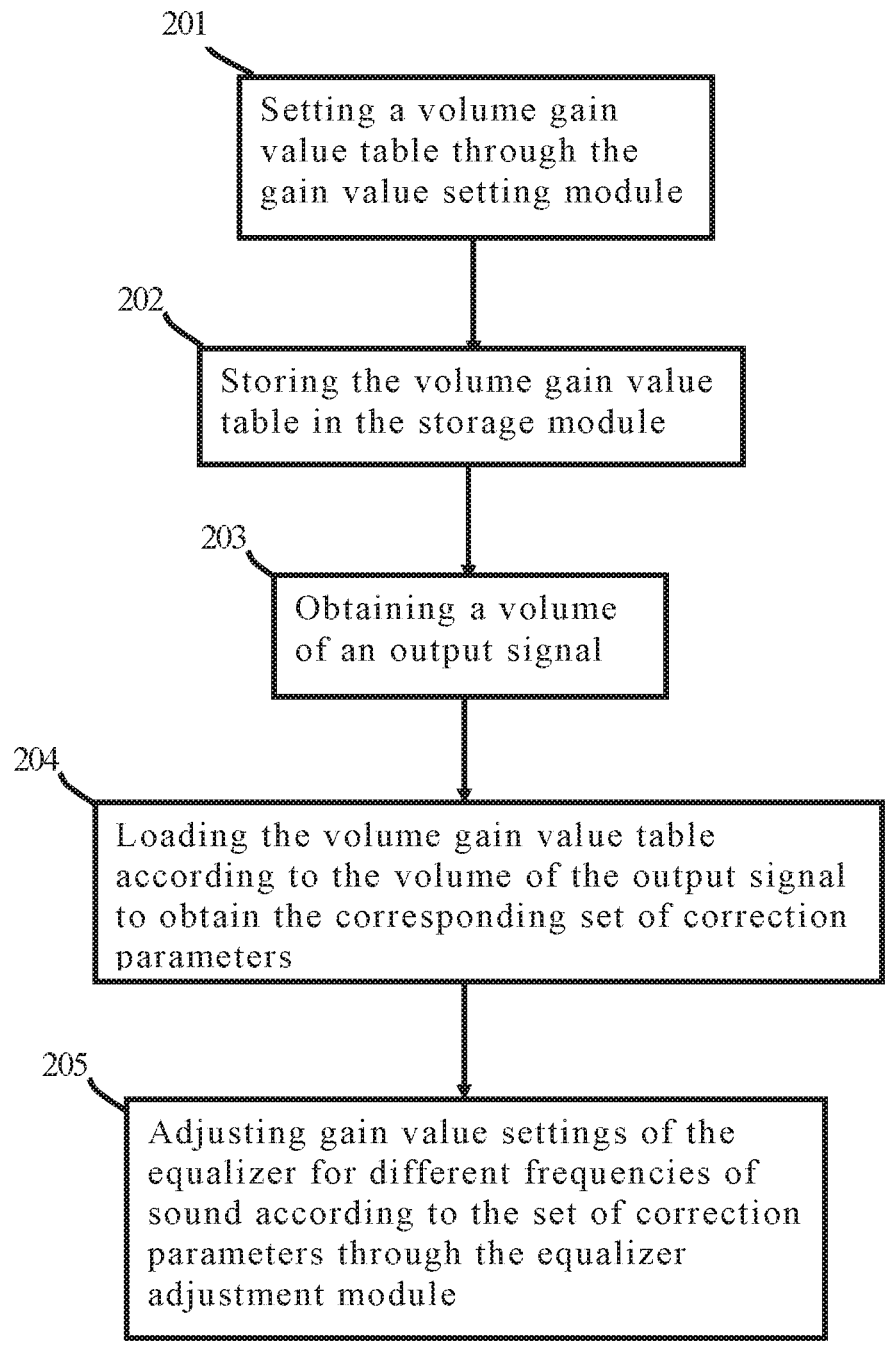
FIG. 2 is a flowchart showing the steps of an equalizer adjustment method of the present invention.

Next, please refer to FIG. 2, which is a flowchart showing the steps of an equalizer adjustment method of the present invention. Please note that the equalizer adjustment method of the present invention is described in the following paragraphs with the example of the aforementioned electronic device 1; however, the equalizer adjustment method of the present invention is not limited to the use of the aforementioned electronic device 1 or a device having an equivalent structure.

First, the present invention performs step 201: setting a volume gain value table through the gain value setting module.

First, the gain value setting module 20 is used for setting a volume gain value table 31 stored in the storage module 30. The gain values of the volume gain value table 31 can be the default values of the electronic device 1 or can be set or adjusted by a user through the gain value setting module 20. However, please note that the scope of the present invention is not limited to the above description. The volume gain value table 31 comprises a plurality of volume values, which are a first volume value to an Nth volume value. Moreover, the volume incrementally increases from the first volume value to the Nth volume value. Each of the plurality of volume values comprises a set of correction parameters. The set of correction parameters comprises a plurality of compensation gain values corresponding to a plurality of target frequencies, respectively.

Next, the present invention performs step 202: storing the volume gain value table in the storage module.

Next, the volume gain value table 31 set by the gain value setting module 20 is stored in the storage module 30.

Next, the present invention performs step 203: obtaining a volume of an output signal.

Next, the volume detection unit 41 is used for obtaining a volume of an output signal of the electronic device 1. In one embodiment of the present invention, the volume detection unit 41 obtains the volume of the output signal by directly detecting a current volume level of the electronic device 1. However, please note that the scope of the present invention is not limited to the above description.

Next, the present invention performs step 204: loading the volume gain value table according to the volume of the output signal to obtain the corresponding set of correction parameters.

The parameter lookup unit 42 is used for loading the volume gain value table 31 according to the volume of the output signal to obtain the set of correction parameters corresponding to the volume of the output signal.

Last, the present invention performs step 205: adjusting gain value settings of the equalizer for different frequencies of sound according to the set of correction parameters through the equalizer adjustment module.

Last, the parameter setting unit 43 is used for adjusting gain value settings of the equalizer 11 for different frequencies of sound according to the set of correction parameters obtained by the parameter lookup unit 42.

It is noted that the equalizer adjustment method of the present invention is not limited to the order of the steps mentioned above. As long as the object of the present invention is achieved, the order of the steps mentioned above can be varied.

As in the above description, according to the aforementioned embodiments, the electronic device 1 can determine how to adjust the settings of the equalizer 11 according to the current volume. Therefore, when the volume of the electronic device 1 is being adjusted, the equalizer 11 changes the gain value of each frequency band simultaneously.

It is noted that the above-mentioned embodiments are only for illustration. It is intended that the present invention cover modifications and variations of this invention provided they fall within the scope of the following claims and their equivalents. Therefore, it will be apparent to those skilled in the art that various modifications and variations can be made to the structure of the present invention without departing from the scope or spirit of the invention.

What is claimed is:

1. An equalizer adjustment method for adjusting gain settings of an equalizer according to a volume of an output signal, applied to an electronic device, the electronic device comprising the equalizer, a gain value setting module, a storage module, and an equalizer adjustment module, the equalizer adjustment method for adjusting gain settings of the equalizer according to the volume of the output signal comprising the following steps:

setting a volume gain value table through the gain value setting module, the volume gain value table comprising a plurality of volume values, which are a first volume value to an Nth volume value, the volume incrementally increasing from the first volume value to the Nth volume value, each of the plurality of volume values comprising a set of correction parameters, the set of correction parameters comprising a plurality of compensation gain values corresponding to a plurality of target frequencies, respectively; wherein when the lower the volume value is, the more the volume of the sound at a low frequency is increased and the more the volume of the sound at a high frequency is decreased;

storing the volume gain value table in the storage module;

obtaining the volume of the output signal;

loading the volume gain value table according to the volume of the output signal to obtain the corresponding set of correction parameters; and adjusting gain value settings of the equalizer for different frequencies of sound according to the set of correction parameters through the equalizer adjustment module.

2. The equalizer adjustment method for adjusting gain settings of the equalizer according to the volume of the output signal as claimed in claim 1 further comprising the following step:

sensing the volume of the output signal by detecting a current volume level of the electronic device.

3. The equalizer adjustment method for adjusting gain settings of the equalizer according to the volume of the output signal as claimed in claim 2 further comprising the following steps:

setting the set of correction parameters of a maximum volume value, a minimum volume value, and an intermediate volume value; and calculating the set of correction parameters of the rest of the volume values by using an interpolation.

4. The equalizer adjustment method for adjusting gain settings of the equalizer according to the volume of the output signal as claimed in claim 3, wherein the plurality of compensation gain values are between −10 and 10.

5. The equalizer adjustment method for adjusting gain settings of the equalizer according to the volume of the output signal as claimed in claim 4, wherein when the plurality of target frequencies are equal to or higher than 10 kHz, the plurality of compensation gain values corresponding to the plurality of target frequencies are between −10 and 0.

6. The equalizer adjustment method for adjusting gain settings of the equalizer according to the volume of the output signal as claimed in claim 4, wherein when the plurality of target frequencies are equal to or lower than 100 Hz, the plurality of compensation gain values corresponding to the plurality of target frequencies are between 0 and 10.

7. An electronic device comprising:

an equalizer;

a gain value setting module used for setting a volume gain value table, the volume gain value table comprising a plurality of volume values, which are a first volume value to an Nth volume value, the volume incrementally increasing from the first volume value to the Nth volume value, each of the plurality of volume values comprising a set of correction parameters, the set of correction parameters comprising a plurality of compensation gain values corresponding to a plurality of target frequencies, respectively; wherein when the lower the volume value is, the more the volume of the sound at a low frequency is increased and the more the volume of the sound at a high frequency is decreased;

a storage module electrically connected to the gain value setting module and used for storing the volume gain value table; and an equalizer adjustment module electrically connected to the storage module and the equalizer, the equalizer adjustment module comprising:

a volume detection unit used for obtaining a volume of an output signal;

a parameter lookup unit used for obtaining the set of correction parameters corresponding to the volume of the output signal; and a parameter setting unit used for adjusting gain value settings of the equalizer for different frequencies of sound according to the set of correction parameters.

8. The electronic device as claimed in claim 7, wherein the volume detection unit obtains the volume of the output signal by detecting a current volume level of the electronic device.

9. The electronic device as claimed in claim 8, wherein the gain value setting module is used for setting the set of correction parameters of a maximum volume value, a minimum volume value, and an intermediate volume value and calculating the set of correction parameters of the rest of the volume values by using an interpolation.

10. The electronic device as claimed in claim 9, wherein the plurality of compensation gain values are between −10 and 10.

11. The electronic device as claimed in claim 10, wherein when the plurality of target frequencies are equal to or higher than 10 kHz, and the plurality of compensation gain values corresponding to the plurality of target frequencies are between −10 and 0.

12. The electronic device as claimed in claim 10, wherein when the plurality of target frequencies are equal to or lower than 100 Hz, the plurality of compensation gain values corresponding to the plurality of target frequencies are between 0 and 10.

13. The electronic device as claimed in claim 7, wherein the gain value setting module is used for allowing a user to set the volume gain value table.

* * * * *